(12) United States Patent
Keller et al.

(10) Patent No.: US 8,383,241 B2
(45) Date of Patent: Feb. 26, 2013

(54) PLASTICIZER-CONTAINING FILMS BASED ON POLYVINYL ACETAL HAVING SELECTIVE PERMEABILITY FOR UV RADIATION

(75) Inventors: Uwe Keller, Bonn (DE); Andreas Karpinski, Odenthal (DE); Jan Beekhuizen, Troisdorf (DE)

(73) Assignee: Kuraray Europe GmbH, Frankfurt (DE)

( * ) Notice: Subject to any disclaimer, the term of this patent is extended or adjusted under 35 U.S.C. 154(b) by 0 days.

(21) Appl. No.: 13/213,139

(22) Filed: Aug. 19, 2011

(65) Prior Publication Data
US 2012/0052310 A1 Mar. 1, 2012

(30) Foreign Application Priority Data

Aug. 26, 2010 (EP) .................. 10174183

(51) Int. Cl.
*B32B 17/10* (2006.01)
*C08K 5/20* (2006.01)
(52) U.S. Cl. .............. 428/436; 428/437; 524/242
(58) Field of Classification Search .......... 428/436, 428/437; 524/242
See application file for complete search history.

(56) References Cited

U.S. PATENT DOCUMENTS

| | | | |
|---|---|---|---|
| 5,492,954 A * | 2/1996 | Babiarz et al. ............... | 524/241 |
| 7,160,624 B2 * | 1/2007 | Fukatani et al. ............. | 428/437 |
| 7,312,275 B2 | 12/2007 | Papenfuhs et al. | |
| 7,528,192 B2 | 5/2009 | Papenfuhs et al. | |
| 2008/0248315 A1 * | 10/2008 | Wiand ........................ | 428/425.3 |

FOREIGN PATENT DOCUMENTS

| | | |
|---|---|---|
| EP | 1527107 B1 | 5/2005 |
| WO | 03020776 A1 | 3/2003 |
| WO | 2004063231 A1 | 7/2004 |
| WO | 2004063232 A1 | 7/2004 |

* cited by examiner

*Primary Examiner* — D. S. Nakarani
(74) *Attorney, Agent, or Firm* — Brooks Kushman P.C.

(57) ABSTRACT

Plasticizer-containing films based on polyvinyl acetal containing a UV absorbers of the oxanilide type of formula (1)

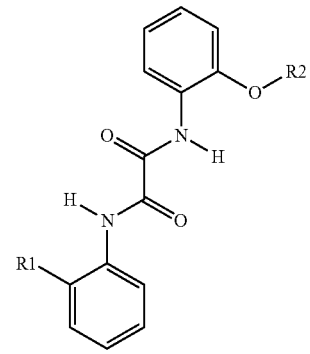

exhibit high UVA transmission while also exhibiting low UVB transmission, with reduced tendency to yellow.

20 Claims, 1 Drawing Sheet

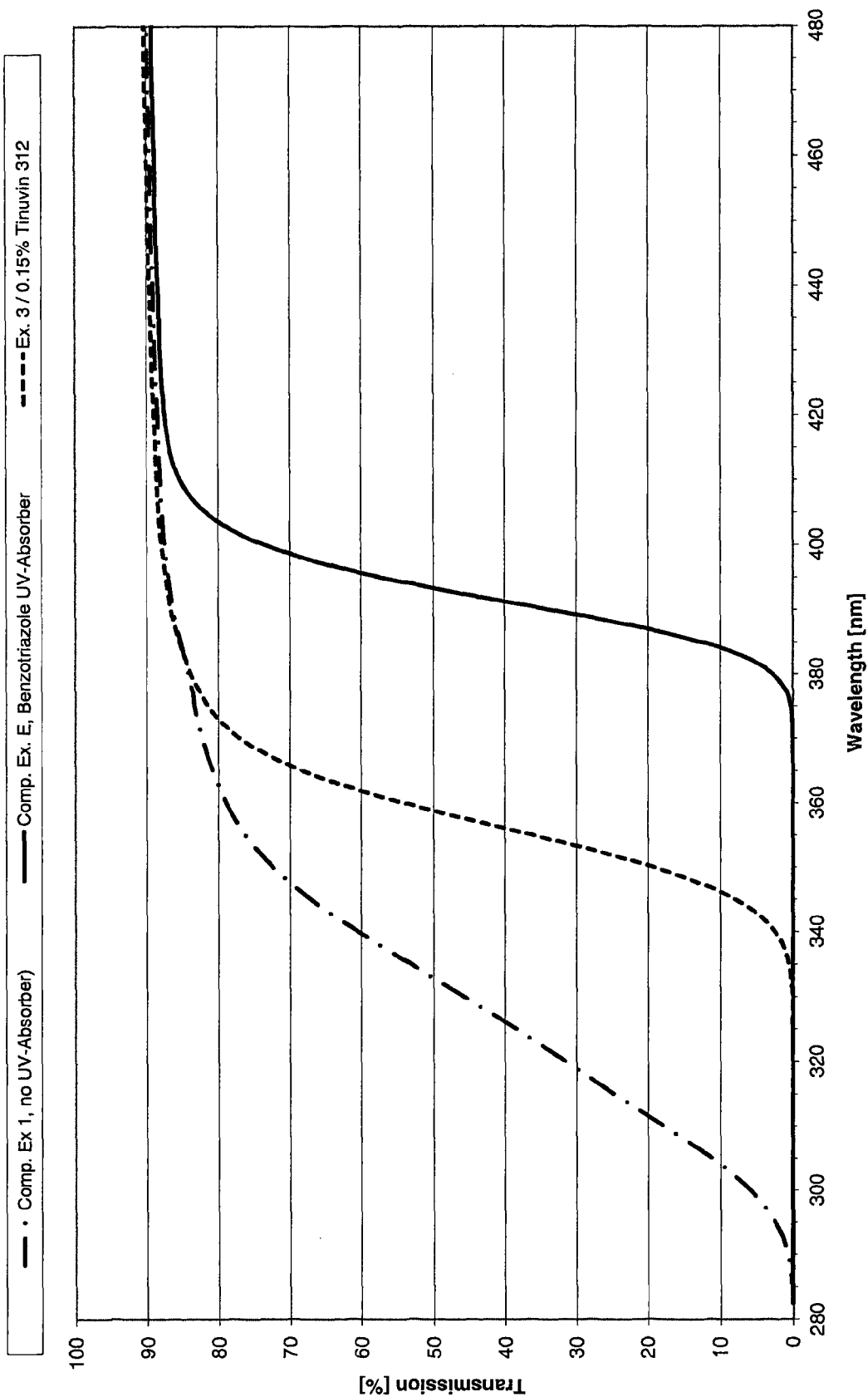

PLASTICIZER-CONTAINING FILMS BASED ON POLYVINYL ACETAL HAVING SELECTIVE PERMEABILITY FOR UV RADIATION

CROSS-REFERENCE TO RELATED APPLICATION

This application claims priority to European Patent Application No. EP 10174183.3 filed Aug. 26, 2010 which is herein incorporated by reference.

BACKGROUND OF THE INVENTION

1. Field of the Invention

The invention relates to plasticizer-containing films based on polyvinyl acetal having a selective permeability for UV radiation and a low tendency to yellow, and to laminated glass produced using these films.

2. Background Art

Plasticizer-containing polyvinyl butyral film (PVB film) of the type usually found on the market for laminated glass has for many decades been furnished with UV absorbers in order to prevent UV radiation from penetrating the laminated glass in contrast with visible light. In this way, almost complete protection from harmful UV radiation can be ensured for persons or objects behind the laminated glass in a simple manner. In addition to protection from cutting injuries, this has the important advantage over monolithic glass that it is largely transparent for UV radiation.

For the use of PVB film as an encapsulating material in photovoltaic modules, increased quantities of UV absorbers are used because it is assumed that due to the intense sunlight exposure of solar modules, yellowing of the PVB film might otherwise occur as a result.

Derivatives of 2-hydroxyphenylbenzotriazole, which are available with various substitution patterns, e.g., under the brand names Tinuvin P, Tinuvin 328, Tinuvin 327, Tinuvin 326, have proven especially successful as UV absorbers. UV absorbers of the benzotriazole type in PVB film are known for their excellent long-term stability, good solubility and high absorption performance in the entire UV range (UV-B and UV-A). Depending on the substitution pattern, however, absorption also occurs more or less strongly also in the visible range of the spectrum, e.g., at 400 nm, so these UV absorbers may cause a certain yellow discoloration of the PVB film, depending on the quantity used and the substituent distribution.

If the most thorough possible protection from UV radiation—i.e., more than 99% absorption—is required for the predominant number of possible applications of laminated safety glass, then there are special applications in which a high permeability for UV radiation would be desirable:

in greenhouses for growing vegetables or cut flowers, the highest possible energy input and a minimum of UV radiation are required. In addition, the insects used for pollination (bees, bumble-bees) are also oriented based on UV contrasts.

in photovoltaic modules with cell types which also use portions of the UV spectrum for generating a photoelectric current and in which the PVB film is arranged in front of them on the side facing the light, the energy efficiency turns out to be lower if the PVB film is almost completely opaque for UV radiation when using conventional UV absorbers of the benzotriazole type.

in applications in the indoor area, where no UV protection is required, an increased UV transmission is allowed, to make colorless elements appear to be more natural in color, in particular in combination with low-iron glass, because UV-stabilized PVB film has a low yellow value of the composite.

as a UV-permeable laminated glass for assembly with UV-A-curing adhesives, e.g., in the furniture glass field.

as part of bird-friendly glazing (i.e., for protection of birds), in which one pane of glass laminated to the PVB film should be partially UV-permeable to achieve a contrast that can be perceived by birds.

SUMMARY OF THE INVENTION

The object of the present invention was to produce a PVB film with a low tendency to yellow, a high transmission for UV-A radiation (325 nm to 400 nm) and visible light with a low permeability for UV-B radiation (280 nm to 325 nm) at the same time.

BRIEF DESCRIPTION OF THE DRAWINGS

FIG. 1 illustrates transmission of the film of Example 3 and the films of Comparative Examples 1 and 3.

DETAILED DESCRIPTION OF THE PREFERRED EMBODIMENTS

Polyvinyl butyral is a copolymer composed predominately of saturated units, i.e., it contains few olefinic or aromatic bonds, although normally as a defect, and for this reason also does not have any significant absorption in the wavelength range of 280-400 nm (UV-A+UV-B). In addition, mainly non-aromatic plasticizers are used for plasticizing PVB, and similar rules apply to these plasticizers with respect to UV absorption. This results in a relatively high inherent UV stability of a mixture consisting of PVB and plasticizer for production of films.

PVB may contain defects and/or impurities which impair its UV stability, depending on the quality of the polyvinyl alcohol and/or butyraldehyde starting materials and the process management in synthesis and processing. In addition, additives such as pigments or phenolic antioxidants added in formulating the film may be sensitive, so PVB films usually contain a UV absorber.

Simply omitting UV absorbers has the disadvantage that large amounts of high-energy UV-B radiation (280-325 nm) are then allowed to pass through, but this may be undesirable for greenhouses, depending on the species of vegetation, and can cause damage to the material in the case of photovoltaic modules while not yielding any further reduction in yellow value for a colorless glazing.

In addition, phenolic antioxidants may themselves undergo yellowing under the influence of UV, in particular UV-B radiation, so that then the yellow value of the film increases over time and the transmission in the visible range of the sunlight spectrum decreases. The commercially most important group of phenolic antioxidants having the substructure (2,5-di-tert-butyl-4-hydroxyphenyl)propionate, including products of the type Irganox 1010, Irganox 1076 and Irganox 1035, among others, leads to yellowing when used in PVB film in a glass laminate under the influence of UV and/or temperature.

A PVB film without any UV absorber will thus be successful only when certain boundary conditions are maintained, inasmuch as it reliably fulfills the various high demands of long-term stability for the respective application. In addition, glazing produced with such materials and/or a photovoltaic module manufactured therefrom also has the disadvantage that the particularly harmful UV-B radiation can penetrate unhindered through the glazing and/or into the PV module.

It has surprisingly been found that a plasticizer-containing polyvinyl acetal film can be produced in a manner such that it has a low tendency to yellow and a high transmission for UV-A radiation and visible light, while at the same time having a low permeability for UV-B radiation. In this way, when used in greenhouse glazing, the direct radiation transmittance $T_E$ (according to EN 410) can be improved and the photoelectric current efficiency can be improved when used in photovoltaic modules. When used in photovoltaic modules in which the PVB film is provided on the side facing the light in front of the cells, the photoelectric current efficiency can be increased significantly if the cells have a sensitivity in the wavelength range of 325 to 380 nm. When using UV-A-permeable PVB film for colorless glazing in particular, the yellow tint can be reduced because the film is completely transparent in the wavelength range of 380 to 450 nm. The transparency for UV-A radiation also allows assembly of laminated glasses containing the PVB film with UV-A-curing adhesives, such that the laminated glass can easily be irradiated with UV-A light, which is needed for curing the adhesive. In addition, because of the transparency for UV-A radiation, a contrast in the UV range which is perceptible to birds can easily be produced, e.g., by partially printing the film with another UV absorber, which additionally covers the UV-A range.

The subject matter of the present invention is therefore a plasticizer-containing film containing at least one polyvinyl acetal and at least one plasticizer characterized by the addition of 0.001 to 1 wt % of at least one compound of the oxanilide type according to formula 1

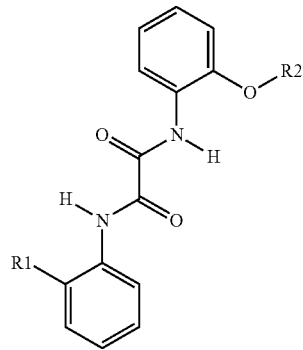

(1)

where R1 and R2 are hydrocarbon radicals with 1 to 10 carbon atoms, as the UV absorber.

The inventive films preferably contain as the oxanilide compound 1,2-ethyl-2'-ethoxyoxalanilide, CAS no. 23949-66-8 as the UV absorber, available commercially from BASF (CIBA) as Tinuvin 312, from SONGWON as Songsorb 3120 or from CLARIANT as Sanduvor VSU, for example.

By varying the substituents it is of course easily possible to create other similar structures, which may be used accordingly within the scope of the invention.

The inventive films preferably contain UV absorbers of the oxanilide type in an amount of 0.01 to 0.75 wt %, more preferably 0.05 to 0.50 wt % and most preferably 0.075 to 0.35 wt %.

The inventive films have a transmission greater than 50%, preferably greater than 70%, more preferably greater than 80% and most preferably greater than 85%, in a thickness of 0.76 mm when the measurement is performed between 2×2 mm low-iron float glass at 380 nm according to EN 410. At the same time, the transmission of such laminates at 325 nm is less than 50%, preferably less than 30% and most preferably less than 20%.

The direct radiation transmittance $T_E$ is increased from approx. 82.5% to more than 84% in comparison with a film finished with a traditional UV absorber of the benzotriazole type (Tinuvin 328), which is advantageous in greenhouse glazing, for example.

For thermal stabilization of the PVB film composition to prevent chain degradation, in particular during the extrusion process, phenolic antioxidants are needed, depending on the presence of a UV absorber.

When using the UV absorbers of the oxanilide type, the higher proportion of UV-A radiation may lead to yellowing of the film due to certain phenolic antioxidants, and thus those which do not contain a (2,5-di-tert-butyl-4-hydroxyphenyl)propionate substructure are preferred. It is possible to use antioxidants having the (2,5-di-tert-butyl-4-hydroxyphenyl)propionate substructure in the film only in a small amount, i.e., preferably no more than 400 ppm, more preferably no more than 200 ppm, yet more preferably no more than 100 ppm, and most preferably no more than 50 ppm.

However, suitable antioxidants which do not contain the (2,5-di-tert-butyl-4-hydroxyphenyl)propionate substructure may be present in an amount of 0.005-0.5 wt % in the film. Suitable antioxidants which do not contain the (2,5-di-tert-butyl-4-hydroxyphenyl)propionate substructure are, for example, bicyclic phenolic antioxidants of the Lowinox 44B25 type or of the Irganox 129 type, monocyclic phenolic antioxidants of the Songsorb 2908 type (CAS: 67845-93-6), BHT (CAS: 128-37-0), p-octylphenol, polycyclic antioxidants, e.g., Topanol CA (CAS: 1843-03-4) or Wingstay L (31851-03-3). Likewise phenolic antioxidants which contain one or more sulfur atoms but do not have the (2,5-di-tert-butyl-4-hydroxyphenyl)propionate substructure may also be considered.

In addition to the UV absorber of the oxanilide type, the inventive films most preferably contain one or more phenolic antioxidants which have the (3-tert-butyl-4-hydroxy-5-methylphenyl)propionate substructure according to formulas (2), (3) or (4).

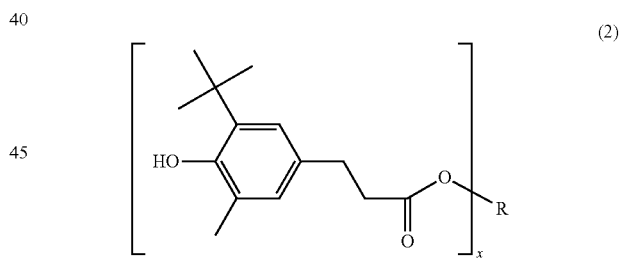

(2)

Suitable stabilizers of formula (2) include, for example, those of formula (3)

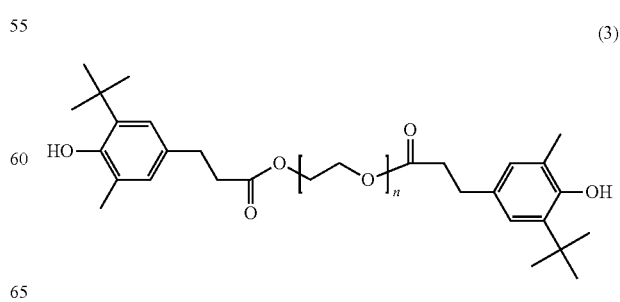

(3)

where n=1 to 10, and those of formula 4.

(4)

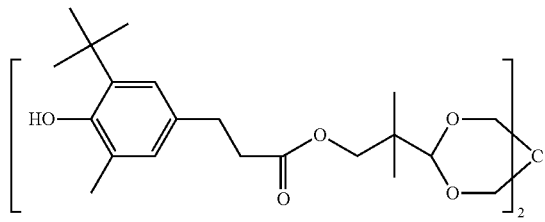

Suitable stabilizers according to formulas (2), (3) or (4) are those of CAS reg. no. 36443-68-2, which are available, for example, as IRGANOX 245 from CIBA, as Lowinox GP45 from CHEMTURA or as Songnox 2450 from SONGWON, as well as those of CAS-reg. no. 90498-90-1, which are available under the names Sumilizer GA 80 from SUMITOMO.

Inventive mixtures or films preferably contain 0.005-0.5 wt %, more preferably 0.01-0.25 wt %, in particular 0.02-0.1 wt %, and most preferably 0.03-0.08 wt % of the phenolic antioxidants with the 3-tert-butyl-4-hydroxy-5-methylphenyl propionate substructure according to formulas (2), (3) or (4).

In addition to the use of the phenolic antioxidants with the 3-tert-butyl-4-hydroxy-5-methylphenyl propionate substructure according to formulas (2), (3) or (4), the thermoplastic mixtures/films may have a basic stabilization with another photostable phenolic antioxidant which is less suitable by itself because of other properties such as high volatility. Within the scope of the present invention, antioxidants with an increased volatility under the extrusion and processing conditions of PVB film are also included, which usually applies to phenolic antioxidants with a molecular weight of less than 300 g/mol. The inventive thermoplastic blend and/or films preferably contain phenolic antioxidants having a molecular weight of less than 300 g/mol in an amount of 0.001-0.25 wt % (based on the film mixture). Especially suitable phenolic antioxidants having a molecular weight of less than 300 g/mol include, for example, BHT (CAS reg. no.: 128-37-0) or 4-tert-octylphenol (CAS reg. no.: 140-66-9).

The aforementioned phenolic antioxidants having a molecular weight of less than 300 g/mol may be used in the stated amount either alone or in combination with another phenolic antioxidant.

In addition to the use of the oxanilide UV absorbers, a low alkali titer of the inventive mixture, e.g. with respect to alkali used in neutralizing the polyvinyl acetal, may yield an improved inherent color and photothermal stability of the inventive film. The alkali titer is, as indicated in the examples, determined by neutralization of the inventive mixture and/or film with hydrochloric acid and is preferably between 2 and 70, more preferably between 3 and 50, and most preferably between 5 and 30.

The alkali titer may be adjusted through corresponding neutralization of the polyvinyl acetal during or after its production by acetalization of polyvinyl alcohol or by adding metal salts to the inventive mixture. The metal salts usually also function as anti-stick agents when using the inventive films for laminated glass.

Inventive films may contain alkaline earth metal ions, zinc ions, aluminum ions and/or alkali metal ions as anti-stick agents. These are present in the mixture/film in the form of the salts of monovalent or polyvalent inorganic acids or monovalent or polyvalent organic acids. Examples of counterions include, for example, the salts of organic carboxylic acids, for example, formates, acetates, trifluoroacetates, propionates, butyrates, benzoates, 2-ethyl hexanoates, etc., but preferably carboxylic acids with fewer than 10 carbon atoms, more preferably less than 8 carbon atoms, yet more preferably less than 6 carbon atoms, still more preferably less than 4 carbon atoms, and most preferably with fewer than 3 carbon atoms. Examples of inorganic counterions include chlorides, nitrates, sulfates, and phosphates. Other counterions may include the anions classified as surfactants such as sulfonate or phosphate surfactants.

The inventive film preferably contains more than 5 ppm, preferably more than 10 ppm, more preferably more than 15 ppm, yet more preferably more than 20 ppm, and most preferably more than 25 ppm of ions selected from the group of alkaline earth metals (Be, Mg, Ca, Sr, Ba, Ra), zinc and aluminum. To avoid unwanted turbidity, on the other hand, no more than 250 ppm of the aforementioned polyvalent metals should be present.

At the same time, the alkali metal ion content (Li, Na, K, Rb, Cs, Fr) in the film based on polyvinyl acetal containing plasticizers should be adjusted to be as low as possible. The film preferably contains less than 150 ppm, more preferably less than 100 ppm, yet more preferably less than 75 ppm, still more preferably less than 50 ppm, even more preferably less than 25 ppm, still even more preferably less than 10 ppm, and most preferably less than 5 ppm alkali metal ions.

The polyvinyl acetals used according to the invention are obtainable as acetalization products of polyvinyl alcohol PVA with aldehydes such as butyraldehyde. Inventive films may contain one or more polyvinyl acetals which may differ in molecular weight, degrees of acetalization, residual alcohol content or number of carbon atoms of the acetal group.

In addition, the aforementioned favorable optical properties of the inventive film may be improved by selection of the polyvinyl alcohol (PVA) used to produce the polyvinyl acetal. If unsaturated units are present in the polymer chain as defects at the level of the PVA, these are necessarily also present in the polyvinyl acetal produced from it so that its absorption of UV radiation is increased and its photostability exacerbated. The unsaturated units may be present in the form of isolated double bonds or double bonds which are in conjugation with one another or in conjugation with carbonyl bonds. These unsaturated units can be detected by UV spectroscopy.

Very large amounts of defects lead to extinctions at 280 nm of almost 1 in measurement of the PVA used in 4 wt % solution in $H_2O$. Polyvinyl alcohols having extinction values of less than 0.5, preferably less than 0.3, in particular 0.2 and especially 0.1 in a 4 wt % aqueous solution at 280 nm are therefore preferably used to produce polyvinyl acetal used according to the invention.

In addition to the use of a UV absorber of the oxanilide type which is largely transparent for UV-A radiation and the use of phenolic antioxidants which do not tend to yellow and/or the use of polyvinyl acetals with an especially low defect content and/or preferred alkali titer, the films produced according to the invention can be finished with one or more non-aromatic light stabilizers, in particular with sterically hindered amines of the HALS type and/or sterically hindered amino ethers (NOR-HALS).

Inventive films preferably contain 0.005-1 wt %, more preferably 0.01-0.5 wt %, in particular 0.03-0.3 wt %, and most preferably 0.05-0.25 wt % of sterically hindered amines of the HAS, HALS or NOR-HALS type as light stabilizers.

Especially suitable sterically hindered amines include those of the general formulas (5), (6) and/or (7).

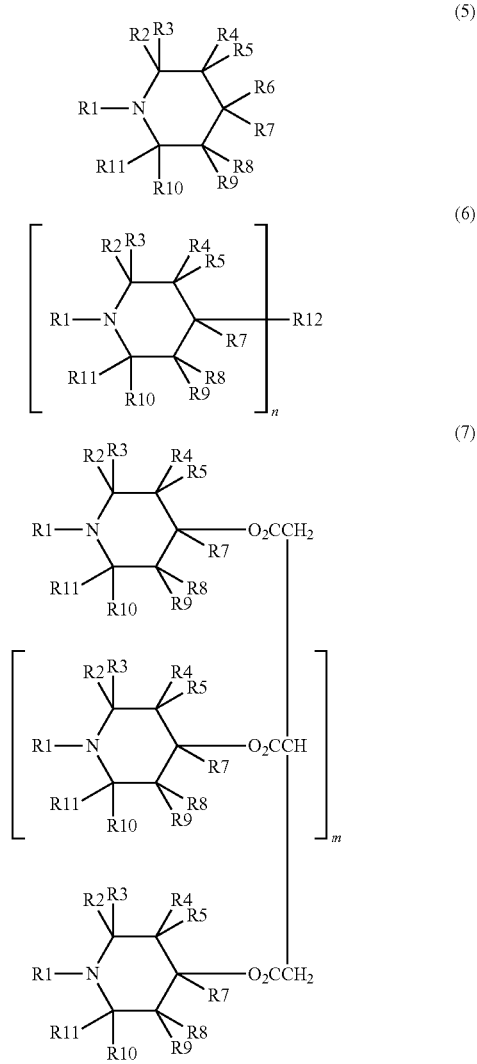

where R1, R2, R3, R4, R5, R6, R7, R8, R9, R10, R11 are, individually, H, or a C1-C20 alkyl, hydroxyalkyl, alkoxyalkyl, or acyloxyalkyl group, each unsubstituted or substituted by aldehyde, keto or epoxide groups, R12 are, individually, a covalent bond or a C1-C20 alkyl, hydroxyalkyl, alkoxyalkyl, acyloxyalkyl group, each unsubstituted or substituted by aldehyde, keto or epoxide groups.

n is 2-4, and
m is 1-10.

Compounds of this type are commercially available, for example, as Tinuvin 123 (NOR-HALS), Tinuvin 144, Tinuvin 622, and Tinuvin 770 as well as its di-N-methylated derivative from BASF (Ciba Specialties). Songlight 2920 from Songwon International, ADK Stab LA-57, LA-52 or LA-62 from Asahi Denka Co., and UVINUL 4050 H from BASF SE are especially suitable.

To synthesize the polyvinyl acetal, polyvinyl alcohol is dissolved in water and acetalized with an aldehyde, e.g., butyraldehyde, formaldehyde or propionaldehyde with the addition of an acid catalyst. The precipitated polyvinyl acetal is separated, washed until neutral, optionally suspended in an alkalized aqueous medium, then washed until neutral again and dried.

The acid used for acetalization must be neutralized again after the reaction. A low alkali metal ion content may be achieved in the synthesis of the polyvinyl acetal, among other things, by omitting the sodium or potassium hydroxides and/or carbonates that are usually used for neutralization of the catalyst or by thoroughly washing the polyvinyl acetal obtained in acetalization. As an alternative to the bases NaOH or KOH, the catalyst acid may also be neutralized from the acetalization step, e.g., by injecting carbon dioxide or ethylene oxide.

The polyvinyl alcohol content of the polyvinyl acetal may be adjusted through the amount of the aldehyde used in acetalization. It is also possible to perform the acetalization with other aldehydes or several aldehydes having 2-10 carbon atoms (for example, valeraldehyde). The films based on plasticizer-containing polyvinyl acetal preferably contain uncrosslinked polyvinyl butyral (PVB), which is obtained by acetalization of polyvinyl alcohol with butyraldehyde.

The use of crosslinked polyvinyl acetals, in particular crosslinked polyvinyl butyral (PVB) is likewise possible. Suitable crosslinked polyvinyl acetals are described, for example, in EP 1527107 B1 and WO 2004/063231 A1 (thermal self-crosslinking of carboxyl group-containing polyvinyl acetals), EP 1606325 A1 (polyvinyl acetals crosslinked with polyaldehydes) and WO 03/020776 A1 (polyvinyl acetals crosslinked with glyoxylic acid), the enclosures of which are herein incorporated by reference.

Within the context of the present invention, terpolymers of hydrolyzed vinyl acetate/ethylene copolymers may also be used as the polyvinyl alcohol. These compounds are usually more than 98 mol % hydrolyzed and contain 1 to 10 wt % of units based on ethylene (e.g., of the Exceval type from Kuraray Europe GmbH). It is also within the scope of the present invention to employ hydrolyzed copolymers of vinyl acetate and at least one other ethylenically unsaturated monomer as the polyvinyl alcohol. The polyvinyl alcohols may be used in pure form or as a mixture of polyvinyl alcohols with different degrees of polymerization or degrees of hydrolysis.

In addition to acetal units, polyvinyl acetals also contain units derived from vinyl acetate and vinyl alcohol. The polyvinyl acetals used according to the invention preferably have a polyvinyl alcohol content of less than 22 wt %, 20 wt %, 18 wt %, 16 wt % or 15 wt %, in order of increasing preference, and in particular less than 14 wt %. The polyvinyl alcohol content should be no lower than 12 wt %.

The polyvinyl acetate content of the polyvinyl acetal used according to the invention is preferably less than 5 wt %, less than 3 wt % or less than 1 wt %, more preferably less than 0.75 wt %, yet more preferably less than 0.5 wt %, and in particular less than 0.25 wt %.

The degrees of acetalization can be determined by calculation from the polyvinyl alcohol content and the residual acetate content.

The films preferably have a total plasticizer content, i.e., the amount of all plasticizers in the film, in the range of 5-45 wt %, 12-36 wt %, 14-32 wt %, or 16-30 wt % in order of increasing preference, and in particular 20-28 wt %. Inventive films and/or laminates/modules bonded to them may contain one or more plasticizers.

One or more compounds selected from the following group are very suitable as plasticizers for the inventive films: di-2-ethylhexyl sebacate (DOS), di-2-ethylhexyl adipate (DOA), dihexyl adipate (DHA), dibutyl sebacate (DBS), triethylene glycol bis-n-heptanoate (3G7), tetraethylene glycol bis-n-heptanoate (4G7), triethylene glycol bis-2-ethyl hexanoate (3GO and/or 3G8) tetraethylene glycol bis-n-2-ethyl hexanoate (4GO and/or 4G8) di-2-butoxyethyl adipate (DBEA), di-2-butoxyethoxyethyl adipate (DBEEA) di-2-butoxyethyl sebacate (DBES), di-2-ethylhexyl phthalate (DOP), diisononyl phthalate (DINP) triethylene glycol bisisononanoate, triethylene glycol bis-2-propyl hexanoate, tris(2-ethylhexyl)phosphate (TOF), 1,2-cyclohexane dicarboxylic acid diisononyl ester (DINCH), diisononyl adipate (DINA) and dipropylene glycol benzoate. This list is exemplary and not limiting.

Most especially suitable plasticizers for the inventive films are plasticizers whose polarity, expressed by the formula $100 \times O/(C+H)$ is less than or equal to 9.4, where O, C and H stand for the number of oxygen atoms, carbon atoms and hydrogen atoms in the respective molecule. The following table shows plasticizers that may be used according to the invention and their polarity values according to the formula $100 \times O/(C+H)$.

| Name | Abbrev. | $100 \times O/(C + H)$ |
|---|---|---|
| di-2-ethylhexyl sebacate | (DOS) | 5.3 |
| di-isononyl adipate | (DINA) | 5.3 |
| 1,2-cyclohexane dicarboxylic acid diisononyl ester | (DINCH) | 5.4 |
| di-2-ethylhexyl adipate | (DOA) | 6.3 |
| dihexyl adipate | (DHA) | 7.7 |
| dibutyl sebacate | (DBS) | 7.7 |
| triethylene glycol bis-2-propyl hexanoate | | 8.6 |
| triethylene glycol bisisononanoate | | 8.6 |
| di-2-butoxyethyl sebacate | (DBES) | 9.4 |
| triethylene glycol bis-2-ethylhexanoate | (3G8) | 9.4 |

For use in photovoltaic modules, the inventive films preferably have a specific resistivity of at least 1E+11 ohm·cm, more preferably at least 5E+11 ohm·cm, yet more preferably 1E+12 ohm·cm, still more preferably 5E+12 ohm·cm, even more preferably 1E+13 ohm·cm, yet even more preferably 5E+13 ohm·cm, and most preferably 1E+14 ohm·cm, all measured at a relative humidity of 85% rH at 23° C.

In addition, the inventive mixtures or films may additionally contain other additives, for example, antistatics, fillers, IR-absorbing nanoparticles and/or chromophores, dyes, surface-active substances, bleaching agents, stabilizers, acid/base buffers, chelating agents, epoxy-group-containing compounds, pigments and adhesion regulators.

In particular the combination with selective IR-radiation-reflecting or absorbing particles is also included.

In addition, the present invention is directed to the use of the inventive films for producing photovoltaic modules, glass laminates, greenhouse covers, in the furniture field, for bird-friendly glazing, and in particular for use
   in greenhouse glazing with increased energy transmission and permeability for UV-A radiation,
   as an encapsulating film for photovoltaic modules with an increased photoelectric current yield by utilizing the UV-A component of the solar spectrum,
   as a laminating film especial for color-neutral architectural glazing,
   as a UV-permeable laminated safety glass for assembly with UV-A-curing adhesives in the furniture glass field, for example,
   as part of a bird-friendly glazing in which one pane of glass laminated to the PVB film is partially UV-transparent in order to achieve a UV contrast as part of a bird-friendly glazing.

Combinations of the inventive films with a high transparency for UV-A radiation with conventional largely UV-opaque films in one component are also conceivable and appropriate. For example, for the application case of a PV module with solar cells embedded between two layers of film, the front film on the side facing the light will have the high transparency described above for UV-A radiation to thereby increase the energy efficiency but the film on the rear side may be opaque for UV-B and UV-A in the usual manner, so that materials behind this side, for example, a polymeric back sheet or a contact can glued to the back is protected from UV damage or in the case of a glass/glass module integrated into the building shell of the interior of the building remains protected from UV radiation.

To achieve color neutrality, when using a plurality of film layers, e.g., 3×0.76 mm, only one of the film layers may be furnished with conventional UV absorbers but the two others are furnished with the oxanilide absorbers used according to the invention. The contribution of the PVB film to the yellow tint of the glazing may be minimized with adequate UV absorption in this way.

Inventive films in the thickness of 0.76 mm preferably have a yellow value db of less than 1, more preferably less than 0.7, yet more preferably less than 0.5 and in particular less than 0.3, and a delta b* value of less than 5, more preferably less than 2.5, yet more preferably less than 2, and in particular less than 1.5.

To achieve maximum energy transmission in the case of greenhouse covers with simultaneous protection against UV-B radiation, the inventive film is combined in particular with low-iron glass. Based on the single glass used for lamination, the glass may have a thickness of 1 to 5 mm, preferably 1.5 to 4 mm and most preferably 2 to 3 mm.

Test and Measurement Methods:

The radiation stability of the films was tested in composite glass between two panes of 2-mm-thick glass of the type Optiwhite® (glass with a low iron oxide content from the company Pilkington). Laminates with the dimensions 15×15 cm were exposed for a period of 20 weeks in the irradiation chamber according to EN 12543. However, in deviation from the conditions of EN 12543, a higher specimen temperature of a constant 80° C. was set because this more closely corresponds to the combined radiation and temperature burden actually occurring in use under unfavorable conditions.

By comparative measurement of the b* value (CIELAB) of the irradiated laminate against an original laminate stored in the dark, the relative increase in the b* value may be used as a measure of the radiation stability of the PVB film with the respective type of stabilizer and/or the respective stabilizer combination. The b* value was measured on a ColorQuest XE color meter from Hunterlab in the CIELAB system in transmission (10°/D65). The delta b* value is obtained as the difference between the b* value of the irradiated specimen and the b* value of the original specimen.

A laminated glass with film 0.76 mm thick with two panes of 2 mm-thick Optiwhite glass was measured on the ColorQuest XE in the Hunterlab 2°/C setting for the purpose of differentiating the inherent color of the extruded film (without additional exposure to irradiation). In this method the inherent color of the glass is averaged out as a zero specimen by measuring the pair of panes of identical glass from the same batch and the contribution of the intermediate layer to the yellow coloration was determined numerically as the yellow value db.

The polyvinyl alcohol and polyvinyl alcohol acetate contents of the polyvinyl acetals were determined according to ASTM D 1396-92. The metal ion content was analyzed by atomic absorption spectroscopy (AAS). The water content and/or moisture content of the films is/are determined using the Karl Fischer method.

To determine the UV absorption of the polyvinyl alcohol used in acetalization, it is measured at a wavelength of 280 nm in a UV/VIS spectrometer, e.g., Perkin-Elmer Lambda 950, as a 4% aqueous solution in a layer thickness of 1 cm. The measured value is based on the dry solids content of the PVA.

The technical radiation properties (degree of light transmittance TL, direct transmittance TE, UV transmittance, transmission at a given wavelength, each expressed in %) of the sample films laminated between 2×2 mm Optiwhite panes were determined according to DIN EN 410 on a UV/VIS spectrometer Perkin-Elmer Lambda 950.

EXAMPLES

Films were produced with the mixtures of the compositions shown in the following tables and thicknesses and were processed as laminates between 2 panes of 2-mm-thick white glass (Optiwhite) and tested.

Comparative Example 1 (without UV stabilizer) shows an extremely high transmission in the UV-B range. Comparative Example 3 shows an excessively low transmission in the UV-A range. Comparative Example 2 has a low enough transmission in the UV-B range and a high enough transmission in the UV-B and UV-A ranges but tends to yellow in radiation testing because of the presence of the phenolic antioxidants Irganox 1076.

The inventive films according to Examples 1-9 show a high transparency for UV-A radiation and are therefore very suitable for all applications requiring the highest possible radiation component in this wavelength range.

At the same time, absorption in the UV-B range is high (i.e., the transmission is low) so that there is sufficient protection and/or adequate stabilization of the material from the high-energy radiation in this wavelength range. This is clear due to the low yellowing in the radiation test.

FIG. 1 illustrates the different rates of transmission of films of Comparative Examples 1 (without UV stabilizer, inadequate absorption in the UV range), Comparative Example 3 (excessively low transmission in the UV-A range) and Example 3 (high absorption in the UV-B range with high transparency for UV-A radiation).

The following abbreviations are used in the tables:
3G8 triethylene glycol bis-2-ethyl hexanoate
DBEA di-2-butoxyethyl adipate (optionally in a mixing ratio by weight with 3G8)
DINCH 1,2-cyclohexanedicarboxylic acid diisononyl ester
PVB polyvinyl butyral with the specified PVA content
S 2450 Songnox 2450
I 1076 Irganox 1076
L 44B25 Lowinox 44B25
S GA-80 Sumilizer GA-80
TE direct radiation transmission TE (300-2500 nm) in %
TL light transmission TL (380-780 nm) in %
UV UV transmission TUV (280-380 nm) in %
Db* delta b* value after 20 weeks of radiation testing based on EN 12543
Tinuvin 328 Tinuvin 328 (benzotriazole type UV absorber)
Tinuvin 312 Tinuvin 312 (oxanilide type UV absorber)
Laminate testing test values in a laminate between 2×2 mm Optiwhite glass
Yellow value db Yellow value db ColorQuest XE
Nd not determined
[a] values in wt %, based on PVB
[b] values in ppm, based on PVB
[c] values in wt %, based on the film

TABLE 1

|  | Comp Ex 1 | Comp Ex 2 | Comp Ex 3 |
|---|---|---|---|
| Film thickness in mm | 0.76 | 0.76 | 0.76 |
| PVOH content of the PVB[a] | 19.8 | 20.1 | 19.8 |
| Antioxidant content in PVB[b] | 800 | 800 | 800 |
| Type of antioxidant | S 2450 | I 1076 | S 2450 |
| PVB[c] | 72.5 | 72.5 | 72.5 |
| 3G8/DBEA 10:1[c] | 27.5 | 27.5 | 27.5 |
| DINCH[c] | — | — | — |
| MgAc$_2$ · 4 H$_2$O[c] | 0.015 | 0.015 | 0.015 |
| Songlight 2920 (HALS)[c] |  |  |  |
| Tinuvin 328[c] |  |  | 0.15 |
| Tinuvin 312[c] |  | 0.15 |  |
| Laminate testing |  |  |  |
| Yellow value db | 0.25 | 0.29 | 0.40 |
| TE % | 86.5 | 84.8 | 82.6 |
| TL % | 90.1 | 90.2 | 89.6 |
| UV % | 64.2 | 28.9 | 0.1 |
| Transmission at 325 nm, % | 38.4 | 0.1 | 0 |
| Transmission at 380 nm, % | 84.2 | 79.2 | 2.7 |
| db* | 3.4 | 8.8 | 0.4 |

TABLE 2

|  | Ex 1 | Ex 2 | Ex 3 | Ex 4 | Ex 5 | Ex 6 | Ex 7 | Ex 8 | Ex 9 |
|---|---|---|---|---|---|---|---|---|---|
| Film thickness in mm | 0.38 | 0.38 | 0.76 | 0.38 | 0.76 | 0.76 | 0.76 | 0.76 | 0.76 |
| PVOH content of PVB[a] | 19.8 | 19.8 | 19.8 | 19.8 | 20 | 19.9 | 20 | 15.2 | 19.9 |
| Antioxidant in PVB[b] | 800 | 800 | 800 | 800 | 800 | 1100 | 800 | 800 | 1100 |
| Type of antioxidant | S 2450 | S 2450 | S 2450 | S 2450 | L44B25 | BHT | S GA-80 | S 2450 | BHT |
| PVB[c] | 72.5 | 72.5 | 72.5 | 72.5 | 72.5 | 72.5 | 72.5 | 74 | 72.5 |
| 3G8/DBEA 10:1[c] | 27.5 | 27.5 | 27.5 | 27.5 | 27.5 | 27.5 | 27.5 | — | 27.5 |
| DINCH[c] | — | — | — | — | — | — | — | 26 | — |
| MgAc$_2$ * 4H$_2$O[c] | 0.015 | 0.015 | 0.015 | 0.015 | 0.015 | 0.015 | 0.015 | 0.015 | 0.015 |
| Songlight 2920 (HALS)[c] |  |  |  |  |  |  |  |  | 0.10 |
| Tinuvin 328[c] |  |  |  |  |  |  |  |  |  |
| Tinuvin 312[c] | 0.05 | 0.10 | 0.15 | 0.20 | 0.15 | 0.15 | 0.15 | 0.15 | 0.15 |
| Laminate testing |  |  |  |  |  |  |  |  |  |
| Yellow value db | 0.10 | 0.10 | 0.23 | 0.10 | 0.20 | 0.23 | 0.21 | 0.16 | 0.20 |
| TE % | 87.1 | 86.7 | 85.2 | 86.4 | 85.3 | 85.2 | 85.4 | 85.3 | 85.1 |
| TL % | 91.0 | 90.9 | 90.5 | 90.9 | 90.4 | 90.3 | 90.5 | 90.8 | 90.2 |
| UV % | 56.6 | 48.9 | 32.5 | 40.4 | 31.7 | 33.6 | 34.5 | 33.0 | 34.2 |
| Transmission 325 nm % | 15.8 | 5.3 | 0.1 | 0.6 | 0.1 | 0.1 | 0.1 | 0.1 | 0.1 |
| Transmission 380 nm % | 87.9 | 87.6 | 83.8 | 87.3 | 83.2 | 83.8 | 83.6 | 83.4 | 83.4 |
| db* | Nd | Nd | 1.2 | Nd | 4.3 | 0.9 | 1.1 | 0.8 | 0.4 |

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A non-yellowing film comprising at least one polyvinyl acetal and at least one plasticizer, and 0.001 to 1 wt % of at least one oxyanilide compound of the formula (1)

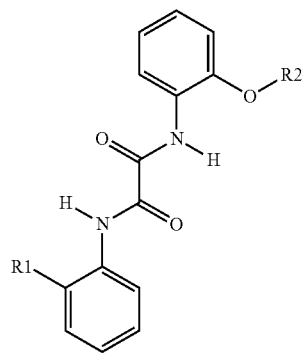

(1)

where R1, R2 each independently are hydrocarbon radicals with 1 to 10 carbon atoms, as a UV absorber wherein the film has a transmission greater than 50% in a film thickness of 0.76 mm when measured between 2×2 mm low-iron float glass at 380 nm in accordance with EN 410, and a transmission at 325 nm of less than 50%.

2. The film of claim 1, wherein a compound (1) is 1,2-ethyl-2'-ethoxyoxalanilide.

3. The film of claim 1, wherein the film has an alkali titer of 2-70.

4. The film of claim 1, wherein the film further comprises 0.001 to 1 wt % of at least one compound of formula (2)

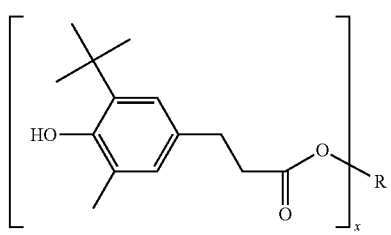

(2)

where R is a hydrocarbon radical of a polyfunctional alcohol, bifunctional cyclic ether, bifunctional cyclic diether, bifunctional dioxane derivative, oligoglycol with 1 to 50 glycol units, or a hydrocarbon radical with 1 to 20 carbon atoms, and x is 1, 2, 3 or 4.

5. The film of claim 1, wherein the film additionally contains phenolic antioxidants with a molecular weight of less than 300 g/mol in an amount of 0.005-0.5 wt %.

6. The film of claim 1, wherein the film additionally contains 0.001 to 1 wt % of non-aromatic hindered amine light stabilizers and/or non-aromatic sterically hindered amino ether light stabilizers.

7. The film of claim 1, wherein the film has a delta b* value of less than 3.

8. The film of claim 1, wherein the film has a yellow value db of less than 1.

9. The film of claim 1, wherein the polyvinyl acetal is produced by acetalization of polyvinyl alcohol which has an extinction of less than 0.5 at 280 nm in a 4 wt % aqueous solution.

10. The film of claim 1, wherein the film contains more than 5 ppm metal ions selected from the group of alkaline earth metals, zinc and aluminum, and contains less than 150 ppm alkali metal ions.

11. The film of claim 1, wherein the film further comprises phenolic antioxidants which do not contain a (2,5-di-tert-butyl-4-hydroxyphenyl) propionate substructure, in an amount of 0.005-0.5 wt %.

12. The film of claim 1, wherein the film further comprises phenolic antioxidants which have a (2,5-di-tert-butyl-4-hydroxyphenyl) propionate substructure, in an amount of no more than 400 ppm.

13. A photovoltaic module, greenhouse cover, furniture glass laminate, colorless glazing, or bird-friendly glazing, comprising a glass laminate containing at least one film comprising polyvinyl acetal and plasticizer of claim 1.

14. The film of claim 1, wherein the film has a transmission greater than 70% in a film thickness of 0.76 mm when measured between 2×2 mm low-iron float glass at 380 nm in accordance with EN 410, and a transmission at 325 nm of less than 50%.

15. The film of claim 1, wherein the film has a transmission greater than 85% in a film thickness of 0.76 mm when measured between 2×2 mm low-iron float glass at 380 nm in accordance with EN 410, and a transmission at 325 nm of less than 50%.

16. The film of claim 1, wherein the film has a transmission greater than 85% in a film thickness of 0.76 mm when measured between 2×2 mm low-iron float glass at 380 nm in accordance with EN 410, and a transmission at 325 nm of less than 30%.

17. The film of claim 1, wherein the film has a transmission greater than 85% in a film thickness of 0.76 mm when measured between 2×2 mm low-iron float glass at 380 nm in accordance with EN 410, and a transmission at 325 nm of less than 20%.

18. The film of claim 1, which is free of IR-absorbing nanoparticles.

19. The film of claim 1, having a specific resistivity of at least $1 \cdot 10^{12}$ Ω·cm.

20. The glass laminate of claim 13, which contains only a single polyvinyl acetal film.

* * * * *